(12) United States Patent
Angelini et al.

(10) Patent No.: US 9,026,195 B2
(45) Date of Patent: May 5, 2015

(54) METHOD FOR CHARACTERIZING THE DEVELOPMENT OF PATHOLOGIES INVOLVING CHANGES IN VOLUMES OF BODIES, NOTABLY TUMORS

(75) Inventors: Elsa Angelini, Paris (FR); Emmanuel Mandonnet, Paris (FR); Julie Delon, Paris (FR)

(73) Assignees: Institute Telecom-Telecom Paris Tech, Paris (FR); Universite Paris Diderot-Paris 7, Paris (FR); Centre National de la Recherche Scientifique, Paris-Cedex (FR)

(*) Notice: Subject to any disclaimer, the term of this patent is extended or adjusted under 35 U.S.C. 154(b) by 208 days.

(21) Appl. No.: 13/323,000

(22) PCT Filed: May 28, 2010

(86) PCT No.: PCT/EP2010/057466
§ 371 (c)(1),
(2), (4) Date: May 14, 2012

(87) PCT Pub. No.: WO2010/136584
PCT Pub. Date: Dec. 2, 2010

(65) Prior Publication Data
US 2012/0220856 A1 Aug. 30, 2012

(30) Foreign Application Priority Data
May 29, 2009 (FR) ...................................... 09 53578

(51) Int. Cl.
*A61B 5/055* (2006.01)
*G06T 7/40* (2006.01)
(Continued)

(52) U.S. Cl.
CPC ............ *G06T 7/403* (2013.01); *G01R 33/5608* (2013.01); *G06T 7/0014* (2013.01); *G06T 2207/10088* (2013.01); *G06T 2207/30016* (2013.01); *G06T 2207/30096* (2013.01)

(58) Field of Classification Search
CPC .......... G06T 2207/10088; G06T 2207/30016; G06T 2207/30096; G06T 7/0014; G06T 7/403
USPC ....................................................... 600/410
See application file for complete search history.

(56) References Cited

U.S. PATENT DOCUMENTS

| | | | |
|---|---|---|---|
| 2005/0273001 A1 | 12/2005 | Schmainda et al. | |
| 2007/0053560 A1* | 3/2007 | Miller et al. | 382/128 |

FOREIGN PATENT DOCUMENTS

| | | |
|---|---|---|
| EP | 0614153 A2 | 9/1994 |
| WO | 00/14668 A1 | 3/2000 |

(Continued)

OTHER PUBLICATIONS

Radke RJ, Andra S, Al-Kofahi O, Roysam B. Image change detection algorithms: a systematic survey. IEEE Trans on Image Processing, 2005. 14(3): 294-307.*

(Continued)

*Primary Examiner* — Jonathan Cwern
*Assistant Examiner* — Amelie R Gillman
(74) *Attorney, Agent, or Firm* — Baker & Hostetler LLP

(57) ABSTRACT

A method for quantifying the development of pathologies involving changes in volume of a body represented via an imaging technique, including normalizing gray levels by a midway technique for two images $I_1$ and $I_2$ representing the same scene, resulting in two normalized images $I'_1$ and $I'_2$; calculating a map of signed differences between the two normalized images $I'_1$ and $I'_2$; and performing one or more statistical tests based on the assumption of a Gaussian distribution of the gray levels for healthy tissues in the normalized images $I'_1$ and $I'_2$ and/or in the calculated difference map. Advantageously, results of two or more of the tests can be combined for a more specific characterization of the development.

16 Claims, 4 Drawing Sheets

(51) Int. Cl.
*G01R 33/56* (2006.01)
*G06T 7/00* (2006.01)

(56) References Cited

FOREIGN PATENT DOCUMENTS

| WO | 02/069799 A1 | 9/2002 |
| WO | 2005/071615 A1 | 8/2005 |
| WO | 2008/014340 A2 | 1/2008 |

OTHER PUBLICATIONS

Van Leemput K, Maes F, Vandermeulen D, Suetens P. Automated model-based tissue classification of MR images of the brain, IEEE Trans on Medical Imaging, 1999. 18(10):897-908.*
Julie Delon: "Midway Image Equalization," Journal of Mathematical Imaging and Vision, vol. 21, No. 2, pp. 119-134 (2004).
Vaidyanathan M. et al.: "Comparison of supervised MRI segmentation methods for tumor volume determination during therapy," Magnetic Resonance Imaging UK, vol. 13, No. 5, 1995, pp. 719-728.

* cited by examiner

METHOD FOR CHARACTERIZING THE DEVELOPMENT OF PATHOLOGIES INVOLVING CHANGES IN VOLUMES OF BODIES, NOTABLY TUMORS

CROSS-REFERENCE TO RELATED APPLICATIONS

This application is a National Stage of International patent application PCT/EP2010/057466, filed on May 28, 2010, which claims priority to foreign French Patent Application No. FR 09 53578, filed on May 29, 2009, the disclosures of each of which are incorporated by reference in their entireties.

FIELD OF THE DISCLOSED SUBJECT MATTER

The present invention relates to a method for quantifying the development of brain tumors. It is notably applicable to the monitoring of the development of low-grade gliomae, but more generally to the monitoring of all the types of progressive pathologies whose monitoring may be undertaken using imaging methods such as, for example, magnetic resonance imaging, more commonly denoted by the acronym MRI.

BACKGROUND

In the framework of progressive pathologies, such as tumors, and notably brain tumors, it is important to be able to appreciate the development of the latter. The determination of the development process of a tumor indeed allows the individual prognosis for a patient to be refined, the therapeutic means to be adjusted according to the aggressivity of the tumor, or also the effectiveness of treatments to be evaluated.

In the particular case of brain pathologies, magnetic resonance imaging, or MRI, is a procedure that is particularly suited to the monitoring of tumors; both for the diagnosis of the tumors prior to any treatment, and for the appreciation of the effectiveness of the treatment. The quantification of the tumor development can therefore be carried out on the basis of a plurality—at least one pair—of MRI images. In practice, it is usual to base such an analysis on longitudinal images coming from two MRI modes: SPGR mode and FLAIR mode, according to the respective acronyms for 'Spoiled Gradient Recall Echo' and 'Fluid Attenuated Inversion Recovery'. It should be noted that other protocols exist for the acquisition of images by MRI, and that the description that follows only relates to these particular acquisition protocols by way of example.

It is then possible for a doctor to apply a manual segmentation of the tumor over a selection of various images, in order to appreciate the spatial extent of the tumor at various cross-sectional levels, at various acquisition times for the images, and in at least one of the two aforementioned MRI modes. Such a job is relatively tedious, and the appreciation of the tumor development according to this method is relatively dependent on the operator, in other words this appreciation exhibits a lack of reproducibility between experts; or worse, this appreciation even exhibits a lack of reproducibility for the same expert. In other words, the same operator may arrive at different conclusions on the basis of identical images. This intra-operator variability is estimated at 15%.

Quantifying the tumor growth is also possible according to the technique, known per se, of the largest diameters. Nevertheless, this method has certain drawbacks. Some of these drawbacks are associated with the orientations of the cross-sectional planes of the images which may be different from one examination to another. In addition, this method is particularly unsuitable following a surgical operation, owing to the presence of the post-operative cavity.

Methods do exist for the automatic determination of the tumor development. Notably, automatic tumor segmentation methods exist, based on relatively complex calculation and image processing algorithms, but which are known to offer relatively poor reliability and robustness. The variability of the parameters relating to the various MRI examinations that the same patient may undergo, for example the operating parameters of the imaging equipment, the position of the head of the patient during the examination, the intrinsic noise phenomena of the imaging apparatus and of its environment, lead to differences in contrast between the images, rendering their direct comparison difficult. Thus, non-linear changes in contrast between sets of images representing volumes of a region of interest do not allow the development of a tumor to be appreciated in a specific manner, on the basis of simple cartographies of differences between these images. These differences in contrast therefore render difficult the automatic comparison between the images. Certain techniques do exist that consist in normalizing the gray levels, and in learning longitudinal anatomical variabilities in noise, then allowing corrections to be applied to the images in order to make them comparable. Nevertheless, these techniques have the drawback of imposing repeated MRI examinations on the patient with the aim of producing precise noise level cartographies. Too large a number of MRI examinations is of course undesirable for reasons of high cost and of stresses imposed on the patient.

In the example of low-grade cerebral gliomae, it is usual to carry out a first MRI examination, followed by an MRI examination three months later, where a classification of the growth of the glioma is carried out. A glioma whose growth after three months is typically greater than 2 millimeters should then be treated as a high-grade glioma, and a glioma whose growth after three months is less than 2 millimeters as a low-grade glioma. This type of pathology typically exhibits relatively weak tumor growths, and hence imposes quantification techniques of millimeter, or even sub-millimeter, precision. It is also particularly advantageous for these techniques to be reproducible, as well as being simple and quick to implement.

SUMMARY

One aim of the present invention is to overcome the aforementioned drawbacks, and to provide a solution to the aforementioned problems.

For this purpose, one subject of the invention is a method for quantifying the development of pathologies involving changes in volume of a body represented via an imaging technique, comprising:
  a first step for normalization of gray levels by a midway technique for two images $I_1$ and $I_2$ representing the same scene, in other words the same anatomical part of the same patent at two successive times, resulting in two normalized images $I'_1$ and $I'_2$,
  a second step for calculation of a map of signed differences between the two normalized images and $I'_1$ and $I'_2$,
  a third step comprising at least one statistical test based on an assumption of a Gaussian distribution of the gray levels for healthy tissues in the normalized images $I'_1$ and $I'_2$ and/or in the difference map calculated in the second step.

In one embodiment of the invention, the first normalization step can determine a midway cumulative histogram of gray levels common to the two images $I_1$ and $I_2$, and equal to the inverse of the arithmetic mean of the inverses of the cumulative histograms of gray levels of the two normalized images $I_1$ and $I_2$, the two images being normalized by application of the midway cumulative histogram to the two images $I_1$ and $I_2$.

In one embodiment of the invention, the first normalization step can determine a midway cumulative histogram of gray levels common to the two images $I_1$ and $I_2$, and equal to the inverse of the geometric mean of the inverses of the cumulative histograms of gray levels of the two images $I_1$ and $I_2$, the two images being normalized on the midway cumulative histogram to the two images $I_1$ and $I_2$.

In one embodiment of the invention, a first test can perform the comparison between a generalized likelihood ratio defined by the equation:

$$GLRT = \frac{p(I'_1(x)/\mu_1, \sigma_1)p(I'_2(x)/\mu_2, \sigma_2)}{p(I'_1(x)/\mu_{1-2}, \sigma_{1-2})p(I'_2(x)/\mu_{1-2}, \sigma_{1-2})},$$

and a first confidence threshold $T_1$ of given value;
$p(I'_i(x)/\mu_i, \sigma_i)$ being the probability density function for the gray level $I'_i(x)$ of a pixel of the normalized image $I'_i$, calculated with a Gaussian function of mean $\mu_i$ and standard deviation $\sigma_i$ to exhibit the observed gray level, the index 1-2 being applicable to the combined values of the normalized images $I'_1$ and $I'_2$, the statistics for a given pixel being carried out over an area extending around the pixel over a given number of pixels.

In one embodiment of the invention, a second test can perform the comparison between the probability density function $p(I'_2(x)-I'_1(x)/\mu_2-\mu_1,\sqrt{\sigma_1^2+\sigma_2^2})$ and a second confidence threshold $T_2$ of given value.

In one embodiment of the invention, a third test can perform the comparison between the probability value $F(|I'_2(x)-I'_1(x)|,0,\sqrt{\sigma_1^2+\sigma_2^2})$ and a third confidence threshold $T_3$ of given value, the function $F$ denoting the integral $$F(t, \mu, \sigma) = 1 - \int_{-t}^{t} \frac{e^{\frac{-(s-\mu)^2}{2\sigma^2}}}{\sqrt{2\pi}\,\sigma} ds.$$

In one embodiment of the invention, the comparison performed by the first test carried out at the third step can be established by the following equation:

$$\ln\left(\frac{p(I'_1(x)/\mu_1, \sigma_1)p(I'_2(x)/\mu_2, \sigma_2)}{p(I'_1(x)/\mu_{1-2}, \sigma_{1-2})p(I'_2(x)/\mu_{1-2}, \sigma_{1-2})}\right) > \ln(T_1).$$

In one embodiment of the invention, the first confidence threshold $T_1$ can be equal to 2.

In one embodiment of the invention, the comparison performed by the second test carried out at the third step can be established by the following equation:

$$p(I'_2(x)-I'_1(x)/\mu_2-\mu_1,\sqrt{\sigma_1^2+\sigma_2^2}) < T_2.$$

In one embodiment of the invention, the second confidence threshold $T_2$ can be equal to $$\frac{e^{-\alpha}}{\sqrt{2\pi\sigma_n^2}},$$

$\alpha$ being a variable non-zero positive real number, and $\sigma_n$ representing the standard deviation of the noise in the difference map.

In one embodiment of the invention, the comparison performed by the third test carried out at the third step can be established by the following equation:

$p(I'_2(x)-I'_1(x)/0,\sqrt{\sigma_1^2+\sigma_2^2}) < T_3$, the third confidence threshold $T_3$ being a non-zero positive real number much less than 1.

In one embodiment of the invention, the tests carried out at the third step can be carried out for all the pixels composing the normalized images $I'_1$ and $I'_2$ and/or the difference map calculated at the second step.

In one embodiment of the invention, the third step can be carried out on the basis of local means based on pluralities of pixels from the normalized images $I'_1$ and $I'_2$ and/or from the difference map calculated at the second step forming a plurality of areas covering the normalized images $I'_1$ and $I'_2$ and/or the difference map.

In one embodiment of the invention, the first test and/or the second test and/or the third test can be carried out at the third step, the results of these tests being combined during a fourth step.

In one embodiment of the invention, said pathology can be a brain tumor.

Another subject of the present invention is a computer program device implementing a method for quantifying the development of pathologies involving changes in volume of a body according to one of the embodiments described hereinabove.

BRIEF DESCRIPTION OF THE DRAWINGS

Other features and advantages of the invention will become apparent upon reading the description, presented by way of example and with regard to the appended drawings which show.

DETAILED DESCRIPTION

Figure 1:
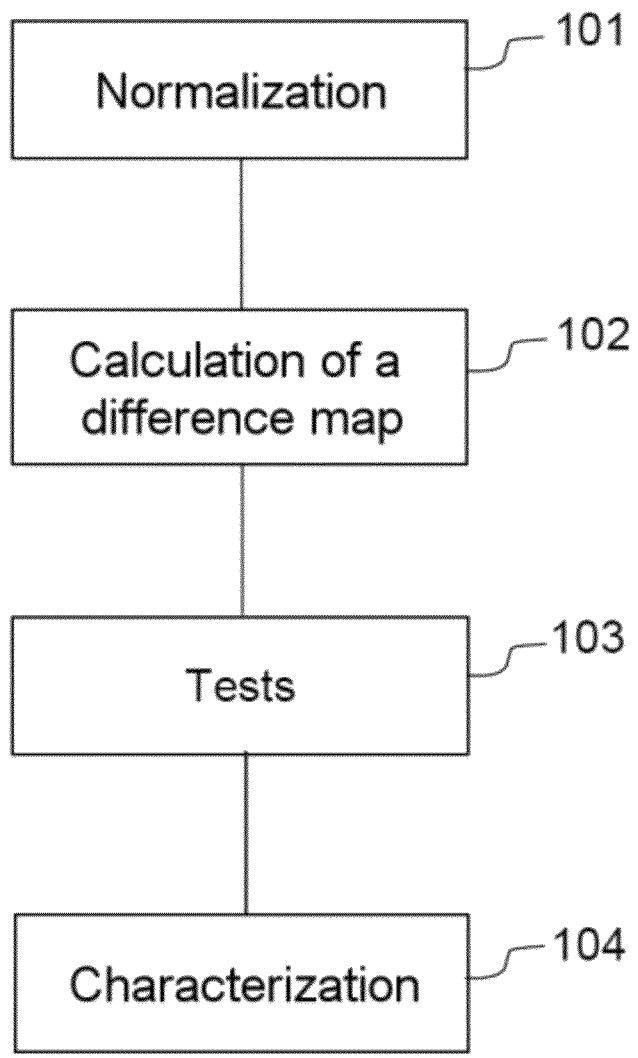
FIG. 1, a flow diagram illustrating a sequence of steps of a method for quantifying the development of tumors according to one exemplary embodiment of the present invention.

FIG. 1 displays a flow diagram illustrating a sequence of steps of a method for quantifying the development of tumors according to one embodiment of the present invention.

In the following part, for the sake of clarity, two images of a volume of interest will be considered comprising a tumor, taken by MRI according to one particular mode of operation, at times $t_1$ and $t_2$, the time $t_1$ being earlier than the time $t_2$. It is clearly understood that the method according to the invention may be applied to a plurality of sets of at least two images produced according to various modes of MRI operation, taken at at least two different times. More generally, the method according to the invention may be applied to imaging techniques other than MRI.

It is also clearly understood that a preliminary step, not shown in FIG. 1, necessary for all the later processing operations, consists in repositioning the two original images taken at times $t_1$ and $t_2$ in order to obtain two images $I_1$ and $I_2$, so that common pixel to pixel calculations are possible under optimal conditions. Repositioning techniques are known per se from the prior art and are not therefore developed in the present description.

With reference to FIG. 1, the purpose of a first step 101 is to normalize the images $I_1$ and $I_2$. The purpose of a second step 102 is to form a difference map between the two images normalized in the step 101. The purpose of a third step 103 is to perform statistical tests on the basis of the normalized images and/or of the difference map produced in the step 102. Advantageously, a fourth step 104 is aimed at utilizing the results of the tests carried out in the third step 103 in order to characterize the tumor development.

The first normalization step 101 allows the problem of variations in contrast between the two images $I_1$ and $I_2$ to be overcome.

It is indeed necessary, prior to a comparison between the images $I_1$ and $I_2$, to modify these two images in order to bring them to a common radiometry. The radiometry of an image is understood to be the dynamic behavior of the gray levels of this image.

A radiometry common to the two images allows their comparison to be focused on the geometrical aspects of the latter, representative of the real state of the region of interest from which these images have been taken. It is however necessary for such a modification not to modify the geometrical characteristics of the images $I_1$ and $I_2$.

In order to satisfy these requirements, the present invention includes the first step 101 of the method, subject of the invention, for normalization according to the method known as "midway" equalization method, described in detail hereinafter with reference to FIG. 2. For an exhaustive description of the midway equalization method, reference may also be made to the article by J. Delon, 'Midway Image Equalization', published in the Journal of Mathematical Imaging and Vision, 2004. 21(2): p. 119-134.

The modifications of the images $I_1$ and $I_2$ carried out during the first step 101 result in two normalized images $I'_1$ and $I'_2$.

The second step 102 allows a difference map between the normalized images $I'_1$ and $I'_2$ to be established A difference map between the two normalized images $I'_1$ and $I'_2$ is an image whose definition is the same as that of the normalized images $I'_1$ and $I'_2$, but where the gray level of each pixel of this image results from the difference between the corresponding gray levels of the two normalized images $I'_1$ and $I'_2$. It should be noted that a display of the difference map may be carried out in the step 102; this requires a calculation of the absolute value of the differences between the gray levels; in contrast, for all the calculations presented hereinbelow, the signed difference between the gray levels of the two normalized images $I'_1$ and $I'_2$ will need to be considered It is then possible to characterize the tumor development, for example, simply by counting the pixels of the difference map whose gray level value is greater than or less than a predetermined threshold value. Nevertheless, the selectivity of such a simple thresholding method is relatively low. The reason for this is that, even if a difference map clearly highlights the tumor growth, corresponding to large differences in gray levels between the normalized images $I'_1$ and $I'_2$, the value of these differences is on the other hand totally unpredictable. This is due to the fact that, by nature, the tumor tissues are relatively non-uniform, and their nature can vary greatly between two MRI examinations. In addition, certain cerebral structures such as the ventricles, containing cephalorachidian fluid, and the neighboring tissues, such as fatty tissues or cranial bone, may also exhibit relatively non-uniform difference values.

Thus, the third step 103 is included; this step allows the characterization of the tumor development to be refined.

The third step comprises at least one statistical test.

The test carried out at the third step 103 can for example be a first statistical test based on a commonly accepted assumption. According to this assumption, for 'normal' cerebral tissues, such as the tissues forming the white matter, the gray matter and the cephalo-rachidian fluid, the gray levels of the pixels individually follow Gaussian distributions. Thus, for each pixel of an image—and by extension, for each voxel of the volume region of interest—the gray level values for the pixels of the two normalized images $I'_1$ and $I'_2$ can exhibit two configurations.

In a first configuration, these gray level values can correspond to the same Gaussian distribution, in which case no change of type of tissue has occurred between the times $t_1$ and $t_2$ when the images from which $I_1$ and $I_2$ come were taken, and thanks to the normalization by midway equalization carried out in the first step 101, these gray level values can be directly compared between the two normalized images $I'_1$ and $I'_2$.

In a second configuration, these gray level values can correspond to two different distributions, owing to a change of type of tissue that occurred between the times $t_1$ and $t_2$ when the original images were taken.

Thus, the present invention advantageously includes in the third step 103 the performance of a first statistical test of the Generalized Likelihood Ratio Test type, or GLRT, in order to characterize the differences in gray levels according to one or the other of the aforementioned configurations. The likelihood ratio GLRT for a given pixel can be calculated according to the following equation:

$$GLRT = \frac{p(I'_1(x)/\mu_1, \sigma_1)p(I'_2(x)/\mu_2, \sigma_2)}{p(I'_1(x)/\mu_{1-2}, \sigma_{1-2})p(I'_2(x)/\mu_{1-2}, \sigma_{1-2})}; \quad (1)$$

where $I'_1(x)$ and $I'_2(x)$ are respectively the normalized values of gray levels for the corresponding pixels in the normalized images $I'_1$ and $I'_2$, $(\mu_i, \sigma^i)_{i=1,2}$ are the mean and the standard deviation of the distribution for the corresponding pixel of the normalized images $I'_i$, and $(\mu_{1-2}, \sigma_{1-2})$ are the mean and the standard deviation of the distribution for the pixels coming from the two normalized images $I'_1$ and $I'_2$, denoted in the following part as combined pixels of the normalized images $I'_1$ and $I'_2$.

The Probability Density Function, or PDF, denoted $p(x/\mu_i, \sigma_i)$, is modeled as a Gaussian PDF $N(\mu, \sigma)$ completely characterized by its mean $\mu$ and its standard deviation $\sigma$. Generally speaking, and applicable to all the equations in which this term appears, the latter is given by the following equation:

$$p(x/\mu, \sigma) = \frac{1}{\sqrt{2\pi}\,\sigma} e^{-\frac{(x-\mu)^2}{2\sigma^2}}. \quad (2)$$

It should be noted that all the statistics $(\mu, \sigma)$ for the PDF are estimated locally on each pixel in areas of $n \times n$ pixels. Thus, when reference is made to a test, it must be understood that a plurality of tests, aiming to cover the entirety of the pixels composing the images, are necessary for the implementation of the invention.

It is considered that this likelihood ratio GLRT is much greater than 1 in the case corresponding to the aforementioned second configuration, in other words where the assumption of separate distributions is the most probable, or in other words, where the gray levels for the pixels of the normalized images $I'_1$ and $I'_2$ come from different distributions.

It is then possible to appreciate the changes on one pixel by comparison of the likelihood ratio with a first confidence threshold $T_1$ of given value.

Advantageously, it can be considered that the change on one pixel is significant if the value of $+\ln(GLRT)$ is greater than $\ln(2)$, that is:

$$\ln\left(\frac{p(I'_1(x)/\mu_1, \sigma_1)p(I'_2(x)/\mu_2, \sigma_2)}{p(I'_1(x)/\mu_{1-2}, \sigma_{1-2})p(I'_2(x)/\mu_{1-2}, \sigma_{1-2})}\right) > \ln(2). \quad (3)$$

This threshold value takes into account the fact that the product of PDFs in the numerator of the aforementioned equation (1) involves two standard deviations, whereas only one standard deviation is involved in the denominator of the equation (3).

In the third step 103, a second type of statistical test may also be carried out based on the assumption of a Gaussian distribution of the difference map. The principle of this second statistical test is to evaluate the probability that a gray level value for a pixel of the difference map comes from a Gaussian distribution, on the basis of the local individual statistics $(\mu_i, \sigma^i)_{i=1,2}$ specific to the normalized images $I'_1$ and $I'_2$.

This second statistical test can be based on the assumption that, if pixels representing uniform tissues individually exhibit Gaussian distributions, then the corresponding pixels of the difference map $I'_2 - I'_1$ also exhibit Gaussian distributions with mean $\mu_2 - \mu_1$ and with standard deviation $\sqrt{\sigma_1^2 + \sigma_2^2}$. It is then possible to deduce the statistics for a Gaussian model of the differences on the basis of the images $I'_1$ and $I'_2$, and to generate a map representative of the probability so that the current difference values follow this distribution. This probability therefore has a value that is higher the better the difference value is modeled by the Gaussian distribution provided by the model, and has a value that is lower the poorer the difference value is interpreted by the Gaussian model, or in other words, where the modeling of the difference by a difference of Gaussian distributions is inappropriate.

According to one exemplary embodiment of the invention, a change on a pixel may be considered as significant if this probability is lower than a second confidence threshold $T_2$.

In order to discriminate the significant difference values, it is necessary to take into account the variability of the gray level values of the pixels in the uniform areas, this variability being due to the noise, and to establish the second confidence threshold $T_2$. It is for example possible to define this second confidence threshold $T_2$ in a definitive manner, or else to provide an operator with means for adjusting it. This second confidence threshold $T_2$ can be used as a control parameter for the type of estimation of the tumor growth that is envisioned, for example depending on the patient's medical history. Thus, a more conservative or optimistic estimation of the tumor growth can be based on a low value of the second confidence threshold $T_2$, whereas a more pessimistic estimation can be based on a high value of this threshold.

In one exemplary embodiment of the invention, an estimation of the variance of the noise $\sigma_{n1}^2$ and $\sigma_{n2}^2$ in the normalized images $I'_1$ and $I'_2$ may be made by estimating the variance in an area of the image background, in other words an area not corresponding to an anatomical structure but to the air. It is also possible to consider a plurality of areas of the image background, and to then calculate a mean value of these variances. The variance $\sigma_n^2$ of the noise in the difference map may subsequently be defined as the sum of the variances $\sigma_{n1}^2$ and $\sigma_n^2$.

The second confidence threshold $T_2$ can then be defined by a value determined according to the equation:

$$T_2 = \frac{e^{-\alpha}}{\sqrt{2\pi\sigma_n^2}}; \quad (4)$$

where $\alpha$ is a variable real coefficient.

Thus, on completion of this statistical test, it may be considered that the changes on a pixel are significant if the associated PDF function is less than the second confidence threshold $T_2$, in other words:

$$p\left(I'_2(x) - I'_1(x)/\mu_2 - \mu_1, \sqrt{\sigma_1^2 + \sigma_2^2}\right) < \frac{e^{-\alpha}}{\sqrt{2\pi\sigma_n^2}}. \quad (5)$$

The second confidence threshold defined by the equation (4) does not reflect a Gaussian white noise model for the MRI noise, but rather a model of the difference values of the Gaussian distribution type with a zero mean value and an estimated noise variance value.

It is for example possible to choose the appropriate value of the second confidence threshold $T_2$ based on the individual data of the patient, and to limit the growth of the tumor to a given percentage of the size of the initial tumor. For example, it is possible to start with a zero value for $\alpha$, then to increase this value by increments of 0.01, until the lowest second confidence threshold $T_2$ is obtained for which the second statistical test carried out in the third step 103 leads to less than 75% of tumor growth for example, this value being appropriate in the particular case of a slow tumor growth associated with a low-grade cerebral glioma.

In one embodiment of the invention, in the third step 103, a third type of statistical test can be carried out, on the difference map, based on the assumption that the mean of the differences for a given point, or else for a mean value within a given area around this point, is zero. In this third type of test, it is the probability $F(|I'_2(x) - I'_1(x)|, 0, \sqrt{\sigma_1^2 + \sigma_2^2})$ that is compared with a third confidence threshold of given value $T_3$, with a selection of the significant differences when the probability is smaller than a given threshold. The third confidence threshold $T_3$ is a non-zero positive real number much less than 1.

For all the tests described hereinabove, the tumor growth can for example be determined on the basis of a tumor initially identified at time $t_1$. The identification of the initial tumor may be carried out manually by the doctor, or else according to a known method of automatic segmentation, for example.

It should also be noted that the aforementioned tests may be carried out in isolation, or else combined with one another, in such a manner as to provide a better specificity. It is, for example, possible to use only the first statistical test of the GLRT type, or else only the second statistical test based on an assumption of Gaussian distribution for the difference map, or else only the third statistical test based on an assumption of equality of the difference means, or alternatively, a combination of the aforementioned first type of test and of the second, a combination of the first type of test and of the third, a combination of the second type of test and of the third, or lastly, a combination of the three aforementioned types of tests.

Other specific statistical tests may be envisioned: it should be remembered that all the tests are based on an assumption of Gaussian distributions at times $t_1$ and $t_2$ for the healthy cerebral tissues, in other words tissues other than those composing the tumor. Some tests additionally assume that the distributions are the same (either by likelihood as in the aforementioned first type of test, or by test for equality of the means, as in the third type of test described hereinabove).

It should also be noted that the signed differences previously mentioned may just as easily correspond to the difference $I'_2 - I'_1$ or $I'_1$ and $I'_2$ between the normalized images, with the respective means $\mu_2 - \mu_1$ or $\mu_1 - \mu_2$ or 0.

Furthermore, all the tests described hereinabove are performed on the original gray or difference values, or on local mean values. In the latter case, the fact that the local standard deviation of the values decreases as the inverse of the square root of the number of points being considered must be taken into account.

The fourth step 104 advantageously consists in combining the results of the statistical tests carried out in the third step 103 in order to characterize the tumor growth. This combination allows the method according to the invention to be endowed with an optimum sensibility and selectivity. Each of the types of tests described hereinabove results, for example, in an image containing Boolean values. It is thus possible to combine several types of tests by carrying out the bit to bit, pixel by pixel, multiplication of these binary images resulting from the various types of tests.

Figure 2:
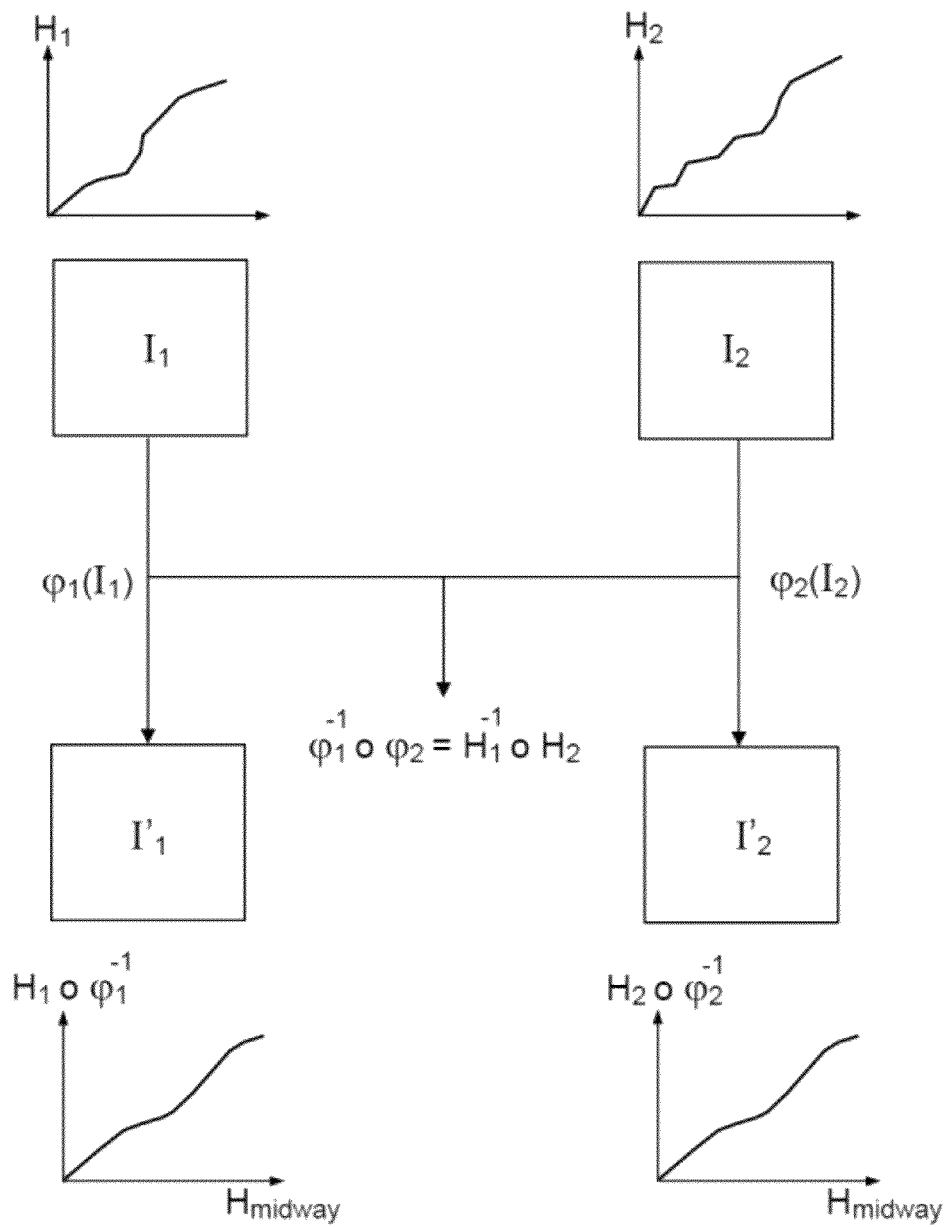
FIG. 2, a flow diagram illustrating the first step for normalization of two images, according to one exemplary embodiment of the present invention.

FIG. 2 displays a flow diagram illustrating the first step for normalization of two images, according to one exemplary embodiment of the present invention.

It should be recalled here that the principle of normalization by midway equalization, carried out in the first step 101 of the method according to the present invention, is to assign a common distribution of gray levels to a pair of images $I_1$ and $I_2$. This distribution is defined as a histogram corresponding to a reasonable "midway", in other words as the inverse of the mean of the inverse cumulative histograms of gray levels of the images $I_1$ and $I_2$.

As is illustrated in FIG. 2, the image $I_1$ undergoes a modification via a first function for change of contrast $\Phi_1$, in order to obtain the normalized image $I'_1$. In the same way, the image $I_2$ undergoes a modification via a second contrast change function $\Phi_2$, in such a manner as to obtain the normalized image $I'_2$. The cumulative histogram of gray levels of the image $I_1$ is denoted $H_1$, and the cumulative histogram of gray levels of the image $I_2$ is denoted $H_2$. The cumulative histograms $H_1$ and $H_2$ are two increasing functions. According to the principle of normalization by midway equalization, the cumulative histograms of gray levels for the normalized images $I'_1$ and $I'_2$ are virtually identical. This cumulative histogram is denoted $H_{midway}$.

As is described in the aforementioned article by J. Delon, contrast change functions $\Phi_1$ and $\Phi_2$ such as $\Phi_1(I_1)$ and $\Phi_2(I_2)$ exhibiting the same cumulative histogram $H_{midway}$ impose and assume that the following equation is verified:

$$\Phi_1^{-1} \circ \Phi_2 = H_1^{-1} \circ H_2 \tag{6}$$

According to one exemplary embodiment of the present invention, the midway cumulative histogram $H_{midway}$ can then be determined by the following equation:

$$H_{midway} = \left(\frac{H_1^{-1} + H_2^{-1}}{2}\right)^{-1}. \tag{7}$$

The normalized images $I'^1$ and $I'_2$, which are the images $I_1$ and $I_2$ that are normalized on the midway cumulative histogram $H_{midway}$, are then given by the following equations:

$$I'_1 = \frac{I_1 + H_2^{-1} \circ H_1(I_1)}{2}, \tag{8}$$

and $$I'_2 = \frac{I_2 + H_1^{-1} \circ H_2(I_2)}{2}. \tag{9}$$

Advantageously, it may be envisioned that the midway histogram $H_{midway}$ be defined not by an arithmetic mean of the inverses of the cumulative histograms $H_1$ and $H_2$, but rather by a geometric mean of the latter. This embodiment can prove appropriate in an application to MRI images, because the non-uniformities of the field generated by MRI equipment can typically be modeled as multiplicative fields. In other words, the intensity of a given pixel of an image I is in fact formalized by I(x).g(x), g being a non-uniformity function.

In this way, in this embodiment of the invention, the midway cumulative histogram $H_{midway}$ can be determined by the following equation:

$$H_{midway} = (\sqrt{H_1^{-1} H_2^{-1}})^{-1} \tag{10}$$

The normalized images $I'_1$ and $I'_2$ can then be given by the following equations:

$$I'_1 = \sqrt{I_1 . H_2^{-1} \circ H_1(I_1)} \tag{11}$$

and $$I'_2 = \sqrt{I_2 . H_1^{-1} \circ H_2(I_2)} \tag{12}$$

It is admitted that the function g(x) is spatially uniform, and that its local variation is small. The assumption can therefore be made that the function g(x) is equivalent to a constant over limited spatial regions. It can thus advantageously be envisioned that the normalization by midway equalization be applied by small areas of images.

It should be noted that all the calculations presented hereinabove are applicable in the case where two images are available, corresponding to examination times $t_1$ and $t_2$. In the case where the images are available at a plurality N of times $t_N$, it is of course possible to transpose the equations (7) to (9), and (10) to (12) by using arithmetic and geometric means, respectively, for N inverse cumulative histograms.

Figure 3:
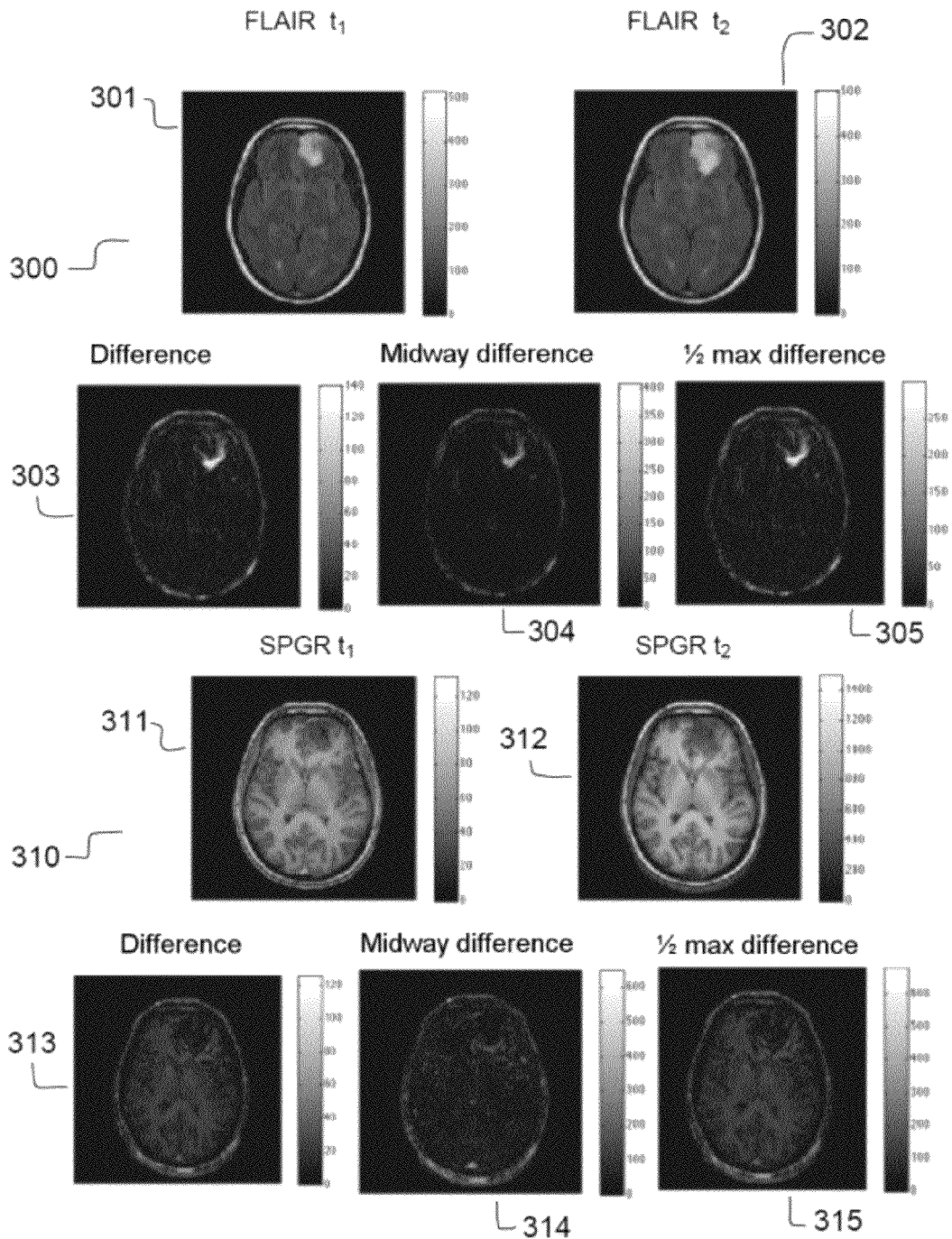
FIG. 3, examples of MRI images according to two imaging modes and of difference maps produced according to various techniques.

FIG. 3 displays examples of MRI images of a human brain at a given level of cross-section, according to two acquisition protocols, and of difference maps produced according to various techniques. This figure helps with the clear understanding of the first step (101) of the method according to the present invention, on the basis of examples coming from real cases.

A first series of images 300 comprises a first image FLAIR 301 taken at time $t_1$ according to the FLAIR MRI mode, and a second image FLAIR 302 taken at time $t_2$. The two images FLAIR 301 and 302 are repositioned.

A first difference map FLAIR 303 is produced simply on the basis of a difference between the first two images FLAIR 301 and 302.

A second difference map FLAIR 304 is produced on the basis of a difference between the first two images FLAIR 301 and 302, normalized by midway equalization according to the method of the present invention.

A third difference map FLAIR 305 is produced on the basis of a difference between the first two images FLAIR 301 and 302, normalized by a normalization technique of the "half-maximum" type known from the prior art.

A second series of images 310 comprises a first image SPGR 311 taken at time $t_1$ according to the SPGR MRI mode, and a second image SPGR 312 taken at time $t_2$. The two images SPGR 311 and 312 undergo a repositioning.

A first difference map SPGR 313 is produced simply on the basis of a difference between the first two images SPGR 311 and 312.

A second difference map SPGR 314 is produced on the basis of a difference between the first two images SPGR 311 and 312, normalized by midway equalization according to the method of the present invention.

A third difference map SPGR 315 is produced on the basis of a difference between the first two images SPGR 311 and 312, normalized by a normalization technique of the "half-maximum" type known from the prior art.

The images presented by way of examples in FIG. 3 underline the superiority of the midway normalization technique employed in the method according to the present invention, with respect to techniques known from the prior art, for the generation of difference maps allowing a tumor growth to be fully appreciated.

Figure 4:
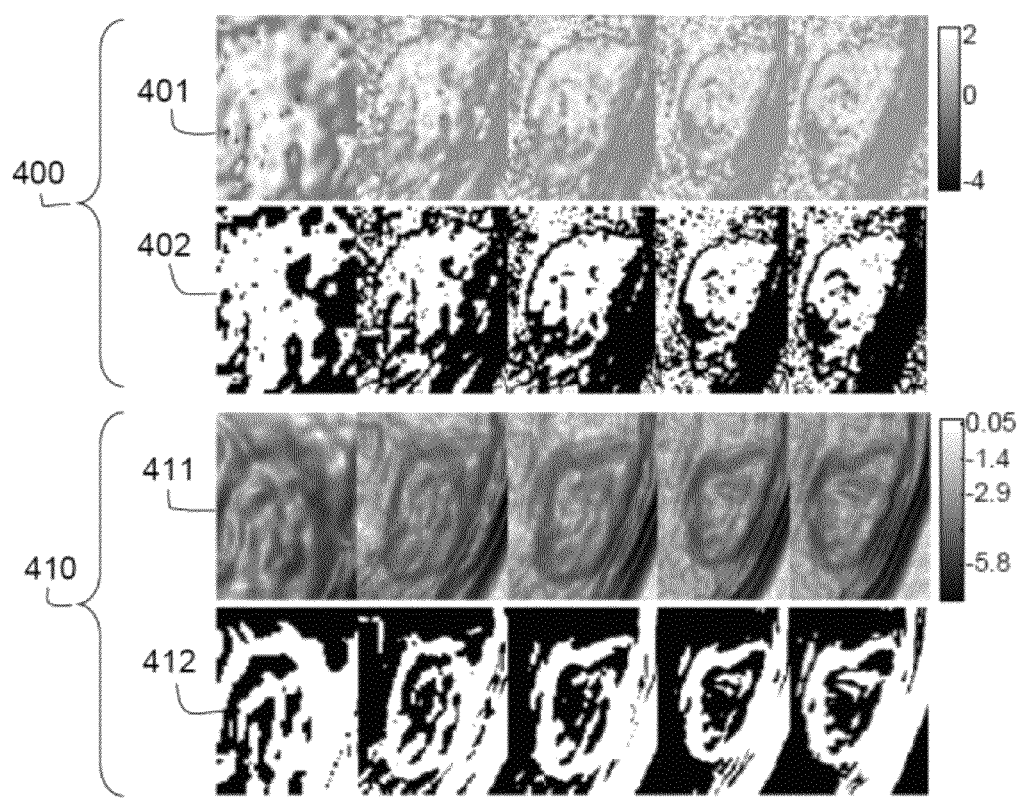
FIG. 4, examples of MRI images representative of a step for characterization of tumor growth of the method according to the present invention.

FIG. 4 presents examples of MRI images within an area of tumor of a human brain, representative of the third step 103 of the method according to the present invention.

A first series of images 400 is representative of the first type of test such as described hereinabove, carried out at the third step 103. A second series of images 410 is representative of the second type of test such as described hereinabove, carried out at the third step 103.

In the first series of images 400, a first series of images from the first test 401 represents maps of the likelihood ratios GLRT calculated in the first type of test of the third step 103 of the method of the invention according to the equation (1). A second series of images from the first test after comparison 402 represents the images of Boolean pixels obtained after comparison of the GLRT with a threshold of predetermined value, such as formalized by the equation (3). These Boolean pixels represent the significant differences according to the criteria of the first type of test carried out in the step 103.

In the second series of images 410, a first series of images 411 from the second type of test represents maps of the probability density functions for the Gaussian differences calculated in the second type of test carried out in the third step 103. A second series of images from the second type of test after comparison 412 represents the images of Boolean pixels obtained after comparison of the aforementioned probability density functions with a threshold of predetermined value, such as formalized by the equation (5). These Boolean pixels represent the significant differences according to the criteria of the second type of test.

The photographs presented by way of examples in FIG. 4 underline the characteristic differences of the results obtained via the two types of tests carried out in the third step 103 of the method according to the present invention. Notably, it can be observed in this figure that common significant differences are detected over the totality of the tumor area of the non-uniform type, and that the selectivity of the tests is different within the areas of the cranial bone.

This example furthermore underlines the advantage afforded by the fourth step 104 of the method according to the invention, allowing the two types of tests to be combined in order to obtain an optimum sensitivity and selectivity.

It should finally be noted that all the examples presented in the present description are applicable to brain tumors. It is however possible to apply the method according to the invention to the quantification of the development of any type of progressive pathology that may be monitored by imaging methods. Notably, the method according to the invention may be applied to the quantification of the development of different types of tumors, or else of bone growth, or again of the growth of scleroses.

The method of the invention can be implemented in any device, or computer program device, such as a computer, designed for the analysis of images and/or for assisted diagnosis.

The utilization of the method according to one of the embodiments presented notably affords the possibility of organizing a mass screening by imaging for any pathology, in particular for the brain, by applying the algorithm to the detection of a difference between a reference MRI and the MRI of the patient being tested. In the case of an anomaly, after verification by a radiologist, the present invention also allows the longitudinal monitoring of the latter, in order to adapt the therapeutic strategy in the case where it proves to be progressive.

The invention claimed is:

1. A computer-implemented method for characterizing a development of pathologies involving changes in volume of a body, the method comprising:
    receiving, from a magnetic resonance imaging device, two images $I_1$ and $I_2$ representing the same anatomical part of the body at two successive times;
    determining, using a computer, a midway cumulative histogram of gray levels common to the two images $I_1$ and $I_2$, wherein said midway cumulative histogram is equal to an inverse of a geometric mean of inverses of cumulative histograms of gray levels for the two images $I_1$ and $I_2$;
    normalizing, using the computer, gray levels by applying the midway cumulative histogram to the two images $I_1$ and $I_2$ resulting in two normalized images $I'_1$ and $I'_2$, respectively;
    calculating, using the computer, a map of signed differences between the two normalized images $I'_1$ and $I'_2$;
    performing, using the computer, one or more statistical tests, including a first test based on an assumption of a Gaussian distribution of gray levels for healthy tissues of the anatomical part of the body in the normalized images $I'_1$ and $I'_2$ or in the calculated difference map; and
    characterizing, using the computer, the development of pathologies based on said performed one or more statistical tests.

2. The computer-implemented method of claim 1, wherein performing the first test comprises comparing, using the computer, a generalized likelihood ratio defined by the equation:

$$GLRT = \frac{p(I'_1(x)/\mu_1, \sigma_1)p(I'_2(x)/\mu_2, \sigma_2)}{p(I'_1(x)/\mu_{1-2}, \sigma_{1-2})p(I'_2(x)/\mu_{1-2}, \sigma_{1-2})},$$

and a confidence threshold $T_1$ of a given value,
    wherein $p(I'_i(x)/\mu_i,\sigma_i)$ is a probability density function for a gray level $I'_i(x)$ of a pixel of a normalized image $I'_1$, calculated with a Gaussian function of mean $\mu_i$ and standard deviation $\sigma_i$, to exhibit an observed gray level, the index 1-2 being applicable to combined values of the normalized images $I'_1$ and $I'_2$, and wherein statistics for a given pixel are determined over an area extending around the pixel over a given number of pixels.

3. The computer-implemented method of claim 2, wherein comparing of the first test is established by the following equation:

$$\ln\left(\frac{p(I'_1(x)/\mu_1, \sigma_1)p(I'_2(x)/\mu_2, \sigma_2)}{p(I'_1(x)/\mu_{1-2}, \sigma_{1-2})p(I'_2(x)/\mu_{1-2}, \sigma_{1-2})}\right) > \ln(T_1).$$

4. The computer-implemented method of claim 3, wherein the confidence threshold $T_1$ is equal to 2.

5. The computer-implemented method of claim 1, wherein performing the first test comprises comparing, using the computer, a probability density function $p(I'_2(x)-I'_1(x)/\mu_2-\mu_1, \sqrt{\sigma_1^2+\sigma_2^2})$ and a confidence threshold $T_2$ of a given value.

6. The computer-implemented method of claim 5, wherein comparing of the first test is established by the following equation:

$$p(I'_2(x)-I'_1(x)|\mu_2-\mu_1,\sqrt{\sigma_1^2+\sigma_2^2}) < T_2.$$

7. The computer-implemented method of claim 6, wherein the confidence threshold $T_2$ is equal to $$\frac{e^{-\alpha}}{\sqrt{2\pi\sigma_n^2}},$$

$\alpha$ being a variable non-zero positive real number, and $\sigma_n$ representing a standard deviation of noise in the calculated difference map.

8. The computer-implemented method of claim 1, wherein performing the first test comprises comparing, using the computer, a probability value $F(|I'_2(x)-I'_1(x)|, 0, \sqrt{\sigma_1^2-\sigma_2^2})$ and a confidence threshold $T_3$ of a given value, the function $F$ denoting integral $$F(t, \mu, \sigma) = 1 - \int_{-t}^{t} \frac{e^{\frac{-(s-\mu)^2}{2\sigma^2}}}{\sqrt{2\pi}\,\sigma} ds,$$

where t is an input variable equal to $|I_2'(x)-I_1'(x)|$.

9. The computer-implemented method of claim 8, wherein comparing of the first test is established by the following equation:

$$F(|I'_2(x)-I'_1(x)|,0,\sqrt{\sigma_1^2+\sigma_2^2}) < T_3,$$

the confidence threshold $T_3$ being a non-zero positive real number less than 1.

10. The computer-implemented method of claim 1, wherein the one or more statistical tests are performed for all pixels composing the normalized images $I'_1$ and $I'_2$ or the calculated difference map.

11. The computer-implemented method of claim 1, wherein the one or more statistical tests are performed based on local means based on pluralities of pixels from the normalized images $I'_1$ and $I'_2$ or from the calculated difference map forming a plurality of areas covering the normalized images $I'_1$ and $I'_2$ or the calculated difference map.

12. The computer-implemented method of claim 1, wherein the one or more statistical tests are selected from the group consisting of:

a statistical test performing a comparison between a generalized likelihood ratio defined by the equation:

$$GLRT = \frac{p(I'_1(x)/\mu_1, \sigma_1)p(I'_2(x)/\mu_2, \sigma_2)}{p(I'_1(x)/\mu_{1-2}, \sigma_{1-2})p(I'_2(x)/\mu_{1-2}, \sigma_{1-2})},$$

and a first confidence threshold $T_1$ of a given value, $p(I'_i(x)/\mu_i, \sigma_i)$ being a probability density function for a gray level $I'_i(x)$ of a pixel of a normalized image $I'_i$, calculated with a Gaussian function of mean $\mu_i$ and standard deviation $\sigma_i$, to exhibit an observed gray level, the index 1-2 being applicable to combined values of the normalized images $I'_1$ and $I'_2$;

a statistical test performing a comparison between a probability density function $p(I'_2(x)-I'_1(x)/\mu_2-\mu_1, \sqrt{\sigma_1^2+\sigma_2^2})$ and a second confidence threshold $T_2$ of a given value; and a statistical test performing a comparison between a probability value $F(|I'_2(x)-I'_1(x)|,0, \sqrt{\sigma_1^2+\sigma_2^2})$ and a third confidence threshold $T_3$ of a given value, the function $F$ denoting the integral $$F(t, \mu, \sigma) = 1 - \int_{-t}^{t} \frac{e^{\frac{-(s-\mu)^2}{2\sigma^2}}}{\sqrt{2\pi}\,\sigma} ds;$$

and wherein the method further comprises combining results of the one or more statistical tests.

13. The computer-implemented method of claim 1, wherein said pathology is a brain tumor.

14. A computer configured to implement a method for characterizing a development of pathologies involving changes in volume of a body, the computer being programmed to:

receive, from a magnetic resonance imaging device, two images $I_1$ and $I_2$ representing the same anatomical part of the body at two successive times;

determine a midway cumulative histogram of gray levels common to the two images $I_1$ and $I_2$, wherein said midway cumulative histogram is equal to an inverse of a geometric mean of inverses of cumulative histograms of gray levels for the two images $I_1$ and $I_2$;

normalize gray levels by applying the midway cumulative histogram to the two images $I_1$ and $I_2$ resulting in two normalized images $I'_1$ and $I'_2$, respectively;

calculate a map of signed differences between the two normalized images $I'_1$ and $I'_2$;

perform one or more statistical tests, including a first test, based on an assumption of a Gaussian distribution of gray levels for healthy tissues of the anatomical part of the body in the normalized images $I'_1$ and $I'_2$ or in the calculated difference map; and characterize the development of pathologies based on said performed one or more statistical tests.

15. The computer of claim 14, wherein the computer is programmed to perform the first test by comparing a generalized likelihood ratio defined by the equation:

$$GLRT = \frac{p(I'_1(x)/\mu_1, \sigma_1)p(I'_2(x)/\mu_2, \sigma_2)}{p(I'_1(x)/\mu_{1-2}, \sigma_{1-2})p(I'_2(x)/\mu_{1-2}, \sigma_{1-2})},$$

and a confidence threshold $T_1$ of a given value,
wherein $p(I'_i(x)/\mu_i, \sigma_i)$ is a probability density function for a gray level $I'_i(x)$ of a pixel of a normalized image $I'_i$, calculated with a Gaussian function of mean $\mu_i$ and standard deviation $\sigma_i$, to exhibit an observed gray level, the index 1-2 being applicable to combined values of the normalized images $I'_1$ and $I'_2$, and
wherein statistics for a given pixel are determined over an area extending around the pixel over a given number of pixels.

16. The computer of claim 15, wherein the computer is programmed to compare the first test by the following equation:

$$\ln\left(\frac{p(I'_1(x)/\mu_1, \sigma_1)p(I'_2(x)/\mu_2, \sigma_2)}{p(I'_1(x)/\mu_{1-2}, \sigma_{1-2})p(I'_2(x)/\mu_{1-2}, \sigma_{1-2})}\right) > \ln(T_1).$$

\* \* \* \* \*

UNITED STATES PATENT AND TRADEMARK OFFICE
CERTIFICATE OF CORRECTION

PATENT NO. : 9,026,195 B2  
APPLICATION NO. : 13/323000  
DATED : May 5, 2015  
INVENTOR(S) : Elsa Angelini et al.

Page 1 of 1

It is certified that error appears in the above-identified patent and that said Letters Patent is hereby corrected as shown below:

On the title page, item 73, in the Assignee information:

Please replace "Institute Telecom-Telecom Paris Tech" with --Institut Telecom-Telecom Paris Tech--.

Signed and Sealed this  
Eighteenth Day of August, 2015

Michelle K. Lee  
*Director of the United States Patent and Trademark Office*